(12) United States Patent
Zanetta et al.

(10) Patent No.: US 9,741,449 B1
(45) Date of Patent: Aug. 22, 2017

(54) SAMPLE AND HOLD CIRCUIT

(71) Applicant: FREESCALE SEMICONDUCTOR, INC., Austin, TX (US)

(72) Inventors: Pedro Barbosa Zanetta, Campinas (BR); Marcos Mauricio Pelicia, Campinas (BR)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/231,946

(22) Filed: Aug. 9, 2016

(51) Int. Cl.
*H03K 5/00* (2006.01)
*H03K 17/00* (2006.01)
*G11C 27/02* (2006.01)
*H02M 3/07* (2006.01)
*H03K 17/687* (2006.01)

(52) U.S. Cl.
CPC .............. *G11C 27/02* (2013.01); *H02M 3/07* (2013.01); *H03K 17/6872* (2013.01)

(58) Field of Classification Search
CPC ...... G11C 27/02; H03K 17/6872; H02M 3/07
USPC .......................................................... 327/94
See application file for complete search history.

(56) References Cited

U.S. PATENT DOCUMENTS

| | | | |
|---|---|---|---|
| 4,982,169 A | 1/1991 | Wyman | |
| 6,734,918 B2 * | 5/2004 | Inoue | H04N 7/035 327/94 |
| 7,113,116 B2 * | 9/2006 | Brewer | G11C 27/026 327/94 |
| 7,157,956 B2 * | 1/2007 | Wei | H03F 3/005 327/337 |
| 7,427,880 B2 * | 9/2008 | Takahashi | G11C 27/026 327/94 |
| 7,673,151 B2 | 3/2010 | Rottschafer et al. | |
| 7,733,191 B2 | 6/2010 | Olmos et al. | |
| 8,065,531 B2 | 11/2011 | Tobergte | |
| 8,265,265 B2 | 9/2012 | Van Rijnswou | |
| 8,289,069 B2 * | 10/2012 | Cheng | H03K 17/962 327/337 |
| 8,487,795 B1 * | 7/2013 | Jiang | G11C 27/024 327/415 |
| 2011/0051927 A1 | 3/2011 | Murray et al. | |
| 2013/0063166 A1 | 3/2013 | Ng et al. | |

OTHER PUBLICATIONS

Chen, Lidong. "SP 800-108. Recommendation for Key Derivation Using Pseudorandom Functions (Revised)." (2009).

(Continued)

*Primary Examiner* — Kenneth B Wells

(57) ABSTRACT

Aspects of various embodiments of the present disclosure are directed to applications utilizing voltage sampling. In certain embodiments, a sample and hold circuit is configured to sample voltages that exceed a tolerance voltage of components. The circuit includes a first and a second capacitors. In a first mode, a voltage difference between an input node and a first reference voltage is sampled using the first capacitor. Also in the first mode, a voltage stored by the second capacitor is referenced to a second reference voltage and provided to a first output node. In a second mode, a voltage difference between an input node and a first reference voltage is sampled using the second capacitor. Also in the second mode, a voltage stored by the first capacitor is referenced to the second reference voltage and provided to a second output node.

18 Claims, 6 Drawing Sheets

(56) References Cited

OTHER PUBLICATIONS

Pique, G.V.; Meijer, M., "A 350nA voltage regulator for 90nm CMOS digital circuits with Reverse-Body-Bias," in ESSCIRC, 2011.
Li, Ting, Yuxin Wang, and Ruzhang Li. "A feedback based charge pump." Anti-Counterfeiting, Security and Identification (ASID), 2011 IEEE International Conference on. IEEE, 2011.
Non Final Office Action for U.S. Appl. No. 15/231,916 dated Oct. 12, 2016.
Notice of Allowance U.S. Appl. No. 15/231,916 dated May 4, 2017.

* cited by examiner

SAMPLE AND HOLD CIRCUIT

OVERVIEW

Aspects of various embodiments relate generally to electronic circuits and more particularly to sample and hold circuits.

Sample and hold circuits, also referred to as track and hold circuits, are used in various applications for sampling analog signals. For instance, in one application, a sample and hold circuit may be used to temporarily store an analog signal until such time as an analog-to-digital converter can convert the signal level to a digital. A sample and hold circuit acquires an analog input voltage signal sampled at a particular instant and stores or holds the voltage sample for a time duration (i.e., specified period of time) on a hold capacitor before processing so that it may be converted to a digital value. Sample and hold circuits typically have two operating states—a sample state and a hold state. During the sample state, a capacitor is charged to a voltage of an analog input signal representation. During the hold state, the capacitor is used to hold an output node at the sampled voltage. However, sampling can be challenging in some applications in which a voltage to be sampled is outside the supply rails and when referenced to ground exceeds a maximum tolerance voltage of components forming the sample and hold circuit.

These and other matters have presented challenges to efficiencies of sample and hold circuit implementations, for a variety of applications.

SUMMARY

Various example embodiments are directed to circuits and methods for sampling voltage differences. Certain embodiments are directed to circuits and methods for sampling voltage differences extending beyond supply voltage rail, which may be greater than maximum tolerance voltage of components (e.g., switches and/or capacitors) used to implement the sample and hold circuit.

According to an example embodiment, an apparatus includes a sample and hold circuit including a first capacitor and a second capacitor. The sample and hold circuit is configured and arranged to sample voltages in first and second modes of operation. In the first mode, a voltage difference between an input node and a first reference voltage is sampled using the first capacitor. Also in the first mode, a voltage stored by the second capacitor is referenced to a second reference voltage and provided to a first output node. In the second mode, a voltage difference between an input node and a first reference voltage is sampled using the second capacitor. Also in the second mode, a voltage stored by the first capacitor is referenced to the second reference voltage and provided to a second output node.

According to another example embodiment, a method is provided for sampling a voltage differences. In a first mode, a voltage difference between an input node and a first reference voltage is sampled using a first capacitor. Additionally, in the first mode, a voltage stored by the second capacitor, referenced to a second reference voltage, is provided to a first output node. In a second mode, a voltage difference between an input node and a first reference voltage is sampled using a second capacitor. Additionally, in the second mode, a voltage stored by the first capacitor, referenced to a second reference voltage, is provided to a second output node.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which.

Figure 1:
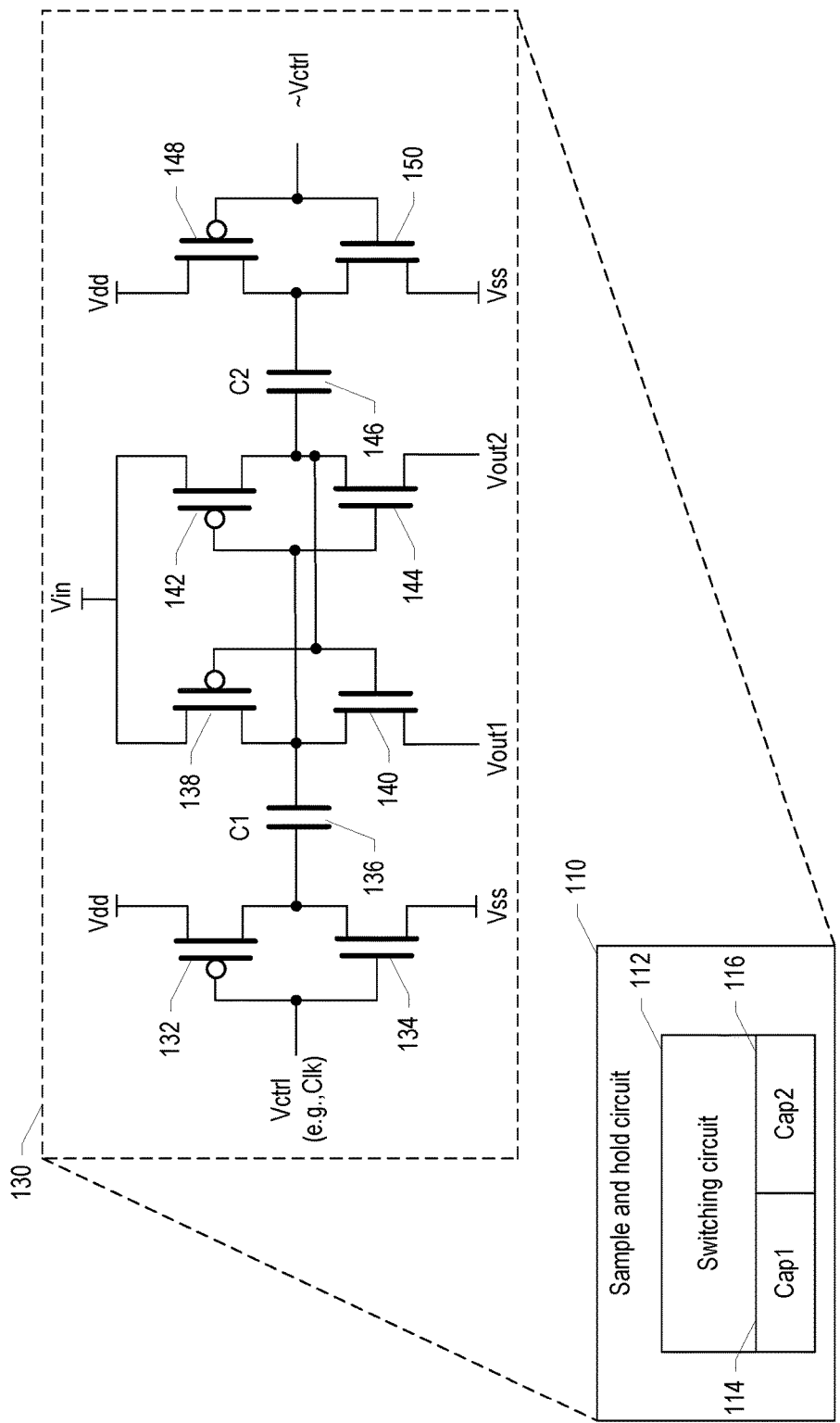
FIG. 1 shows a schematic of an example circuit for sampling a voltage difference, in accordance with one or more embodiments of the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems, and methods involving sampling of voltage difference nodes in an electronic circuit. In certain implementations, aspects of the present disclosure have been shown to be beneficial for sampling voltages that are greater than a maximum tolerance voltage of components used to implement a sample and hold circuit. Such voltages may be presented, for example, when sampling voltage differences extending outside of power supply rails.

While not necessarily so limited, various aspects may be appreciated through a discussion of examples using such exemplary contexts.

According to an example embodiment, an apparatus includes a sample and hold circuit including a first capacitor and a second capacitor. The sample and hold circuit is configured to sample voltage differences in first and second modes of operation. In the first mode, the first capacitor is used to sample a voltage difference between an input node and a first reference voltage and the second capacitor is used to hold an output at a voltage indicative of a previously sampled voltage difference referenced to a second reference voltage. Conversely, in the second mode, the second capacitor is used to sample the voltage difference between the input node and the first reference voltage and the first capacitor is used to hold the output node at a previously sampled voltage difference referenced to the second reference voltage.

In some embodiments, the sample and hold circuit is configured for sampling a high voltage exceeding maximum rated voltage of components (e.g., a maximum voltage allowed between terminals) of the sample and hold circuit. Such high voltages may be presented, for example, when sampling voltages outside of supply voltage rails used to power the sample and hold circuitry. For instance, if a voltage of an input node is greater than the supply voltage rails, a voltage difference between the input node and Vss may be greater than the maximum voltage difference than a devices is rated to tolerate between at least two pair of terminals of the device. Sampling high voltages may be challenging for many applications. For example, a component of a sample and hold circuit may be damaged if voltage across the terminals of the component exceeds a certain maximum voltage. For instance, a typical sample and hold circuit implemented with components having a maximum rated voltage of 1.98 V may become damaged if used to sample a high voltage (e.g., 3V). In certain embodiments, a sample and hold circuit is configured to sample voltages outside of supply voltage rails and higher than the devices maximum voltage range while avoiding damage to circuit components. Damage to components is avoided, for example, by sampling a voltage difference between an input node and one of the supply voltage rails and then referencing the sampled voltage difference to the other supply voltage rail to set the output voltage. As a result, the output node is set to a voltage within the supply voltages rails. As the output node voltage is within the supply voltage rails, the output voltage may be processed (e.g., quantized by an analog-to-digital-converter (ADC)) using circuits operating within the supply voltage rails. In this manner, the sample and hold circuit may be implemented with smaller and/or less expensive components, which have maximum tolerance voltages that are less than the high voltage to be sampled.

As an illustrative example, a high positive voltage (Vin$^+$) above Vdd may exceed a maximum rated voltage of components and cause damage to one or more components. The Vin$^+$ voltage may be sampled with reference to Vdd using a capacitor connected between Vin$^+$ and Vdd in the first mode. In the second mode, the voltage difference (Vin$^+$–Vdd) stored by the capacitor may then be referenced to Vss and provided to an output node (e.g., by connecting the capacitor between the output and Vss). As a result, the output is set to a voltage (Vss+Vin$^+$–Vdd) within the voltage rails.

As another example, a negative voltage (Vin$^-$) may be sampled with reference to Vss using a capacitor connected between Vss and Vin$^-$ in the first mode. In the second mode, the voltage difference (Vss–Vin$^-$) stored by the capacitor may then be referenced to Vdd and provided to an output node. The output is thereby set to a voltage (Vdd–Vss+Vin$^-$) within the voltage rails.

In certain embodiments, the sample and hold circuit may be configured for voltage difference sampling. For instance, in some applications, the sample and hold circuit may be used to sample a voltage difference, having a higher voltage outside of supply voltage rails and higher than the devices maximum voltage range, without damaging to circuit components having a lower maximum tolerance voltage.

For ease of explanation, the examples are primarily described with reference to sampling of a voltage difference extending above the supply voltage rails. As discussed in more detail, with reference to FIG. 5, it is understood that the examples may be adapted for sampling a voltage difference extending below the supply voltage rails.

In an example embodiment, a sample and hold circuit includes first and second capacitors and a switching circuit. The switching circuit is configured to selectively connect the capacitors for either sampling and/or holding the output node at the sampled voltage in each of the first and second modes. In the first mode, the switching circuit connects the first capacitor between the input node and an upper supply voltage (e.g., Vdd) for sampling. In the first mode, the switching circuit also connects the second capacitor between the output node and a lower supply voltage (e.g., Vss) to hold the output node at a previously sampled voltage difference referenced against the lower supply voltage. In the second mode, the switching circuit connects the first capacitor between the output node and the lower supply voltage to hold the output node at the voltage difference sampled in the first mode and referenced against the lower supply voltage. In the second mode, the switching circuit also connects the second capacitor between the input node and the upper supply voltage for sampling a new voltage difference.

In the following description, various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Turning now to the figures, FIG. 1 shows a schematic of an example circuit for sampling a voltage difference, in accordance with one or more embodiments of the present disclosure. The circuit includes a sample and hold circuit 110 having first and second capacitors 114 and 116 and a switching circuit 112. The circuit is configured to sample voltage differences in first and second modes of operation. In the first mode, the switching circuit is configured to connect the first capacitor 114 for sampling a voltage difference between the input node and a first reference voltage. In the first mode, the switching circuit also connects the second capacitor 116 for hold the output node at a voltage difference previously sampled by the second capacitor and referenced against a second reference voltage. In a second mode, the switching circuit connects the second capacitor 116 for sampling the voltage difference between the input node and the first reference voltage. In the second mode, the switching circuit also connects the first capacitor 114 for holding the output node at a voltage difference previously sampled by the first capacitor and reference against a second reference voltage.

In different embodiments, the switching circuit 112 of the sample and hold circuit 110 may be implemented using various circuit arrangements. Block 130 shows an example sample and hold circuit having first and second capacitors 136 and 146 and a switching circuit formed by transistors 132, 134, 138, 140, 142, 144, 148, and 150. In this example, the switching circuit operates in the first mode in response to a control signal Vctrl having a first value (logic 1) and operates in the second mode in response to Vctrl having a second value (logic 0). In some embodiments, the Vctrl signal may be driven by an oscillating clock signal to cause the sampling signal to sample the input node and updates the voltage at the output node twice in each cycle of the clock signal. In some other embodiment, the Vctrl control signal may be a non-periodic signal. For ease of explanation, the examples are primarily described with reference to a mode of the sample and hold circuit being controlled by a clock signal Clk.

In this example, the transistors are arranged to form two inverter circuits 132/134 and 148/150 and two pairs of switches 138/140 and 142/144. In a first mode, switch 138 connects a first terminal of the first capacitor 136 to input node (Vin) and inverter 132/134 connects a second terminal of the first capacitor 136 to an upper supply voltage Vdd via transistor 132. Also in the first mode, switch 144 connects a first terminal of second capacitor 146 to an output node Vout2 and inverter 148/150 connects a second terminal of the capacitor 146 to a lower supply voltage (Vss) via transistor 150. In this arrangement, the capacitor 136 is charged to a voltage difference between the input node Vin and Vdd, and the capacitor 146 is used to hold the value of output node Vout2 to a previously sampled voltage difference referenced to Vss.

In a second mode, inverter 138/140 connects the first terminal of the first capacitor 136 to output node Vout1 via 140 and inverter 132/134 connects the second terminal of the first capacitor 136 to Vss via transistor 134. Also in the first mode, inverter 142/144 connects the first terminal of second capacitor 146 to the input node Vin via transistor 142 and inverter 148/150 connects the second terminal of the capacitor 146 to the upper supply rail voltage Vdd via transistor 148. In this arrangement, the capacitor 146 is charged to voltage equal to a difference between the input node and Vdd, and the capacitor 136 is used to hold the value of output node Vout1 to a previously sampled voltage difference referenced to Vss.

In the example shown in FIG. 1, the sample and hold circuit provides a sampled voltage difference to a respective output Vout1 or Vout2 in each of the two modes. In some implementations, the outputs Vout1 or Vout2 may be connected to provide the sampled voltage differences to a shared output node in both of the first and second modes. For example, one or more switches may be configured to connect Vout2 to the shared output node in the first mode and connect Vout1 to the shared output node in the second mode.

Figure 2:
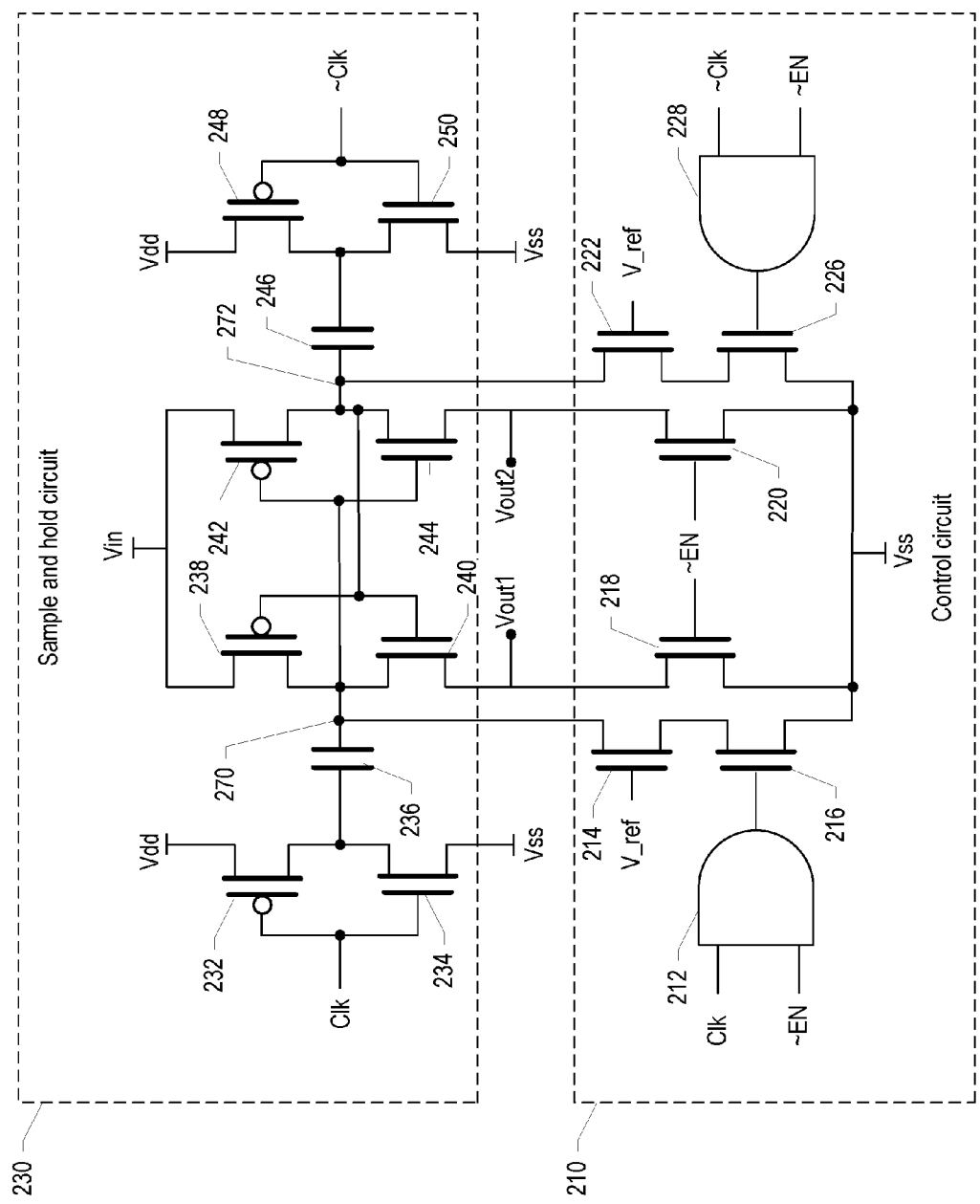
FIG. 2 shows a schematic of another example circuit for sampling a voltage difference, in accordance with one or more embodiments of the present disclosure.

FIG. 2 shows a block diagram of another example circuit for sampling a voltage difference, in accordance with one or more embodiments of the present disclosure. The circuit includes a sample and hold circuit 230 for sampling voltage differences. The sample and hold circuit 230 includes first and second capacitors 236 and 246 and a switching circuit having transistors 232, 234, 238, 240, 242, 244, 248, and 250 configured to operate as described with reference to capacitors 136 and 146 and switching circuit transistors 132, 134, 138, 140, 142, 144, 148, and 150 of the sample and hold circuit 130 shown in FIG. 1.

In this example, the sample and hold circuit 230 is connected to a control circuit 210 configured to ensure correct initialization of the sample and hold circuit 330 and ensure that voltage across the components do not exceed a maximum tolerance voltage. In this example, the control circuit 210 is configured to disable and initialize the sample and hold circuit 230, in response to EN having a first value (e.g., logic 0), and enable the sample and hold circuit 230 in response to a control signal (EN) having a second value (e.g., logic 1). In response to the control signal EN being set to a logic 0, the control circuit 210 holds output nodes Vout1 and Vout2 at Vss via transistors 218 and 220 and holds one of nodes 270 or 272 at Vss according to the Clk signal state, which may change while the sample and hold circuit is disabled without interfering on the correct initialization. As a result, each of the cross-coupled inverters 338/340 and 342/344 is placed in a defined state (i.e., logic 0 or logic 1). The initialization of the sample and hold circuit reduces the startup time needed to sample a set an output node to a correct voltage when the EN control signal is set to logic 1.

Initialization may be performed using various circuit arrangements. In this example, a first logical AND circuit 212 causes transistor 216 to pull node 370 to Vss in response to the control signal EN being set to logic 0 and the mode selection signal Clk indicating the value for the first mode (i.e., Clk set high). A second logical AND circuit 228 causes transistor 226 to pull node 272 down to Vss in response to the control signal EN being set to logic 0 and the mode selection signal Clk indicating the value for the second mode (i.e., Clk set low). Transistors 214 and 222 are included in the current paths to protect against overvoltage that would otherwise damage transistors 216 and 226. The transistors 214 and 222 configured to disconnect transistors 216 and 226 from nodes 270 and 272 when voltage of nodes 270 and 272 exceeds a certain voltage (e.g., V_ref–a threshold voltage of the transistors 214 and 222).

Figure 3:
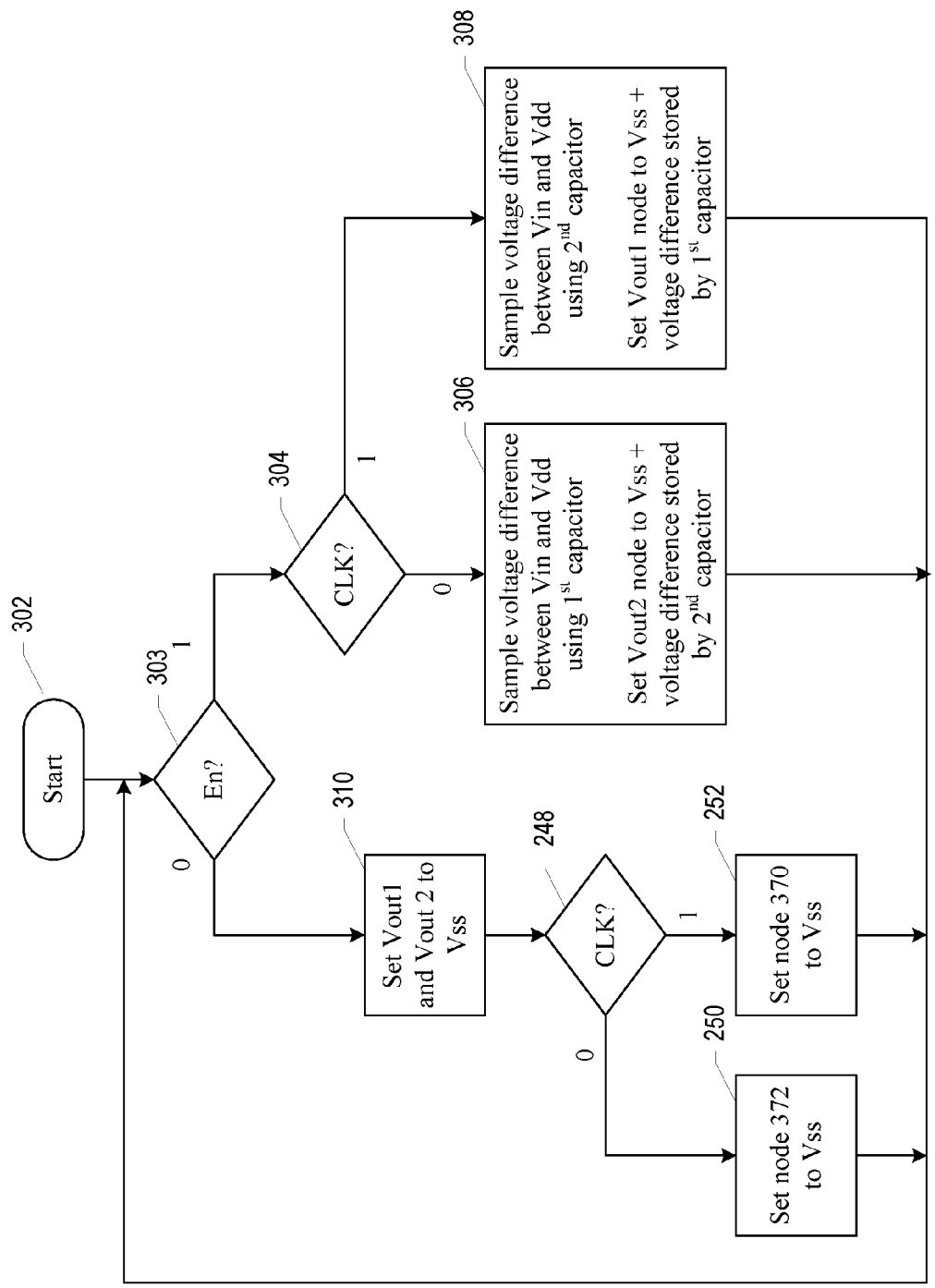
FIG. 3 shows a flow chart of an exemplary process for sampling a voltage difference, in accordance with one or more embodiments of the present disclosure.

FIG. 3 shows a flow chart of an exemplary process for sampling a voltage difference, in accordance with one or more embodiments of the present disclosure. The process is started at block 302. If the block is enabled (i.e., EN set to logic 1) at decision block 303, the process progress from decision block 303 to 304. If the sampler is operating in the first mode, where Clk is set to logic 0, the process proceeds from decision block 304 to block 306. At block 306, a voltage difference between the voltage at an input node (Vin) and an upper supply voltage (Vdd) is sampled using a first capacitor. Sampling may be performed, for example, by connecting a first terminal of the first capacitor to the input node and connecting a second terminal of the first capacitor to Vdd. Concurrently at block 306, an output node is set to a voltage (e.g., Vin–Vdd) stored by a second capacitor referenced to a second supply voltage. The output may be set, for example, by connecting a first terminal of the second capacitor to the output node and connecting the second terminal of the second capacitor to Vss.

If the sampler is operating in the second mode, where CLK is set to logic 1, the process proceeds from decision block 304 to block 308. At block 308, a voltage difference between the voltage at the input node (Vin) and the upper supply voltage (Vdd) is sampled using the second capacitor. Sampling may be performed, for example, by connecting the first terminal of the second capacitor to the input node and connecting the second terminal of the second capacitor to Vdd. Concurrently at block 306, the output node is set to the voltage (e.g., Vin–Vdd) stored by the first capacitor while in the first mode. The output may be set, for example, by connecting a first terminal of the first capacitor to the output node and connecting the second terminal of the first capacitor to Vss.

If the circuit is disabled (i.e., EN set to logic 0), the process progress from 303 to block 310 where the outputs nodes Vout1 and Vout2 are hold at Vss. If the Clk signal is set to logic 1 at decision block 248, the process proceeds to block 252 where node 370 is set to Vss. Otherwise, if Clk is set to logic 0, the process proceeds to block 250 where node 372 is set Vss.

Figure 4:
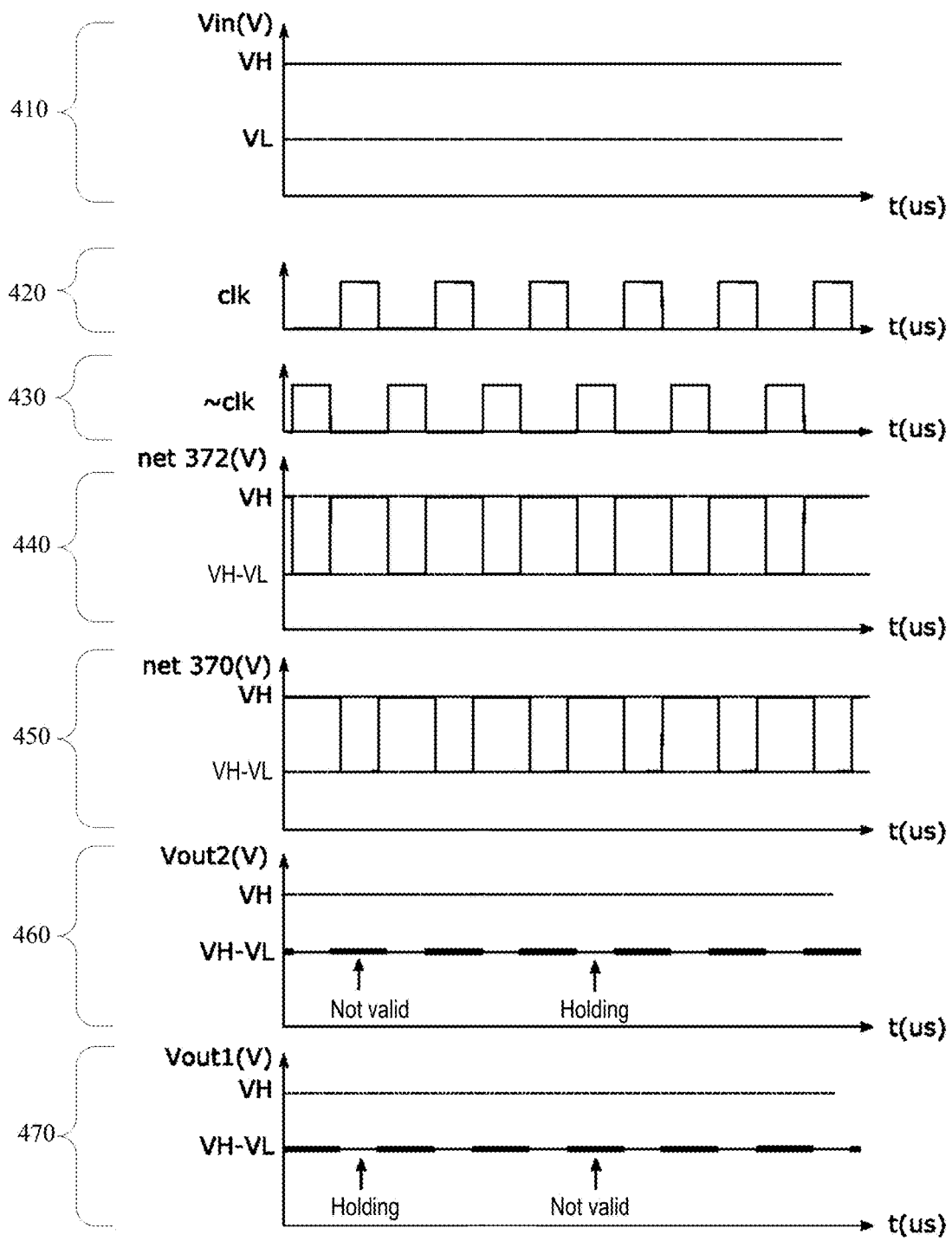
FIG. 4 is a graph showing voltages generated at various nodes of the sample and hold circuit shown in FIG. 2 during operation, in accordance with one or more embodiments of the present disclosure.

FIG. 4 is a graph showing voltages generated at various nodes of the example circuit 200 shown in FIG. 2 during operation, in accordance with one or more embodiments of the present disclosure. Waveform 410 shows a voltage VH at node Vin. Waveforms 420 and 430 show Clk and ~Clk signals used to select between the two possible operation modes. As discussed with reference to FIG. 2, the switching circuit 230 is configured to connect the first capacitor 236 between Vin and Vdd when Clk is low and connect the first capacitor between Vout1 and Vss when Clk is high. The switching circuit is configured to connect the second capacitor 246 between Vin and Vdd when ~Clk is low and connect the second capacitor between Vout2 and Vss when ~Clk is high. Waveform 440 shows a voltage at node 272 in FIG. 2. Waveform 450 shows a voltage at node 270 in FIG. 2. Waveform 460 shows a voltage at output Vout2 during operation. Waveform 470 shows a voltage at output Vout1 during operation. Output Vout2 is held at a valid voltage (VH−VL) when ~Clk is high. Output Vout1 is held at a valid voltage when Clk is high.

Figure 5:
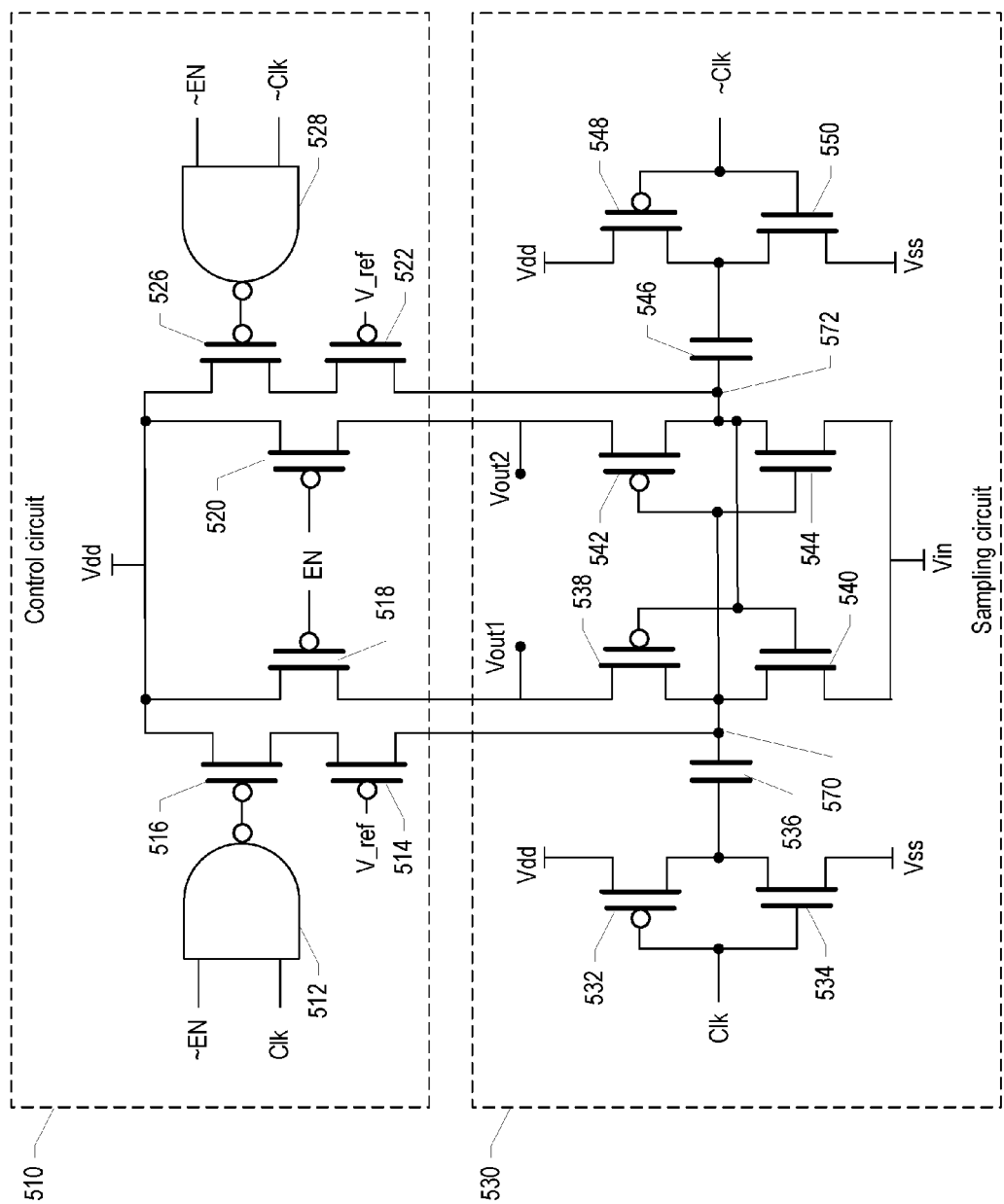
FIG. 5 shows a schematic of another example circuit for sampling a voltage difference, in accordance with one or more embodiments of the present disclosure.

As previously indicated, in some embodiments, a sample and hold circuit may be configured for sampling a voltage extending below supply voltage rails. FIG. 5 shows a block diagram of another example circuit configured for sampling voltage differences extending below the supply voltage rails (e.g., negative voltages), in accordance with one or more embodiments of the present disclosure. The circuit includes a sample and hold circuit 530 configured to sample voltage differences between at an input node and a first supply voltage and hold an output node at a previously sampled voltage difference referenced to a second supply voltage. The sample and hold circuit 530 includes first and second capacitors 536 and 546 and a switching circuit having transistors 532, 534, 538, 540, 542, 544, 548, and 550.

In this example, as described with reference to sample and hold circuit 130 in FIG. 1, the transistors are arranged to form two inverter circuits 532/534 and 548/550 and two pair of switches 538/540 and 542/544. However, in contrast to sample and hold circuit 130, sample and hold circuit 530 connects the capacitors 536 and 546 between an input node and the lower supply voltage Vss for sampling.

In a first mode, inverter 538/540 connects a first terminal of the first capacitor 536 to input node (Vin) via transistor 540 and inverter 532/534 connects a second terminal of the first capacitor 136 to the lower supply voltage Vss via transistor 534. Also in the first mode, transistor 542 connects a first terminal of second capacitor 546 to an output node (Vout2) and inverter 548/550 connects a second terminal of the capacitor 546 to the upper supply voltage Vdd via transistor 548. In this arrangement, the capacitor 536 is charged to a voltage difference between Vss and the input node and the capacitor 546 is used to hold the value of output node Vout2 to a previously sampled voltage difference referenced to Vdd.

In a second mode, switch 538 connects the first terminal of the first capacitor 536 to output node Vout1 and inverter 532/534 connects a second terminal of the first capacitor 536 to Vdd via transistor 532. Also in the first mode, transistor 544 connects the first terminal of second capacitor 546 to the input node Vin and inverter 548/550 connects the second terminal of the capacitor 546 to the lower supply voltage Vss via transistor 550. In this arrangement, the capacitor 546 is charged to voltage equal to a difference between the Vss and the input node and the capacitor 536 is used to hold the value of output node Vout1 to a previously sampled voltage difference referenced to Vdd.

In this example, the sample and hold circuit 530 is connected to a control circuit 510 configured to enable the sample and hold circuit 530 in response to the control signal EN being set to logic 1, and disable the sample and hold circuit 530, in response to EN being set to logic 0. The sample and hold circuit is disabled by holding output nodes Vout1 and Vout2 at Vdd via transistors 518 and 520 in response to the control signal EN being set to a logic 0.

The control circuit 510 also includes circuitry to disable and initialize the sample and hold circuit 530 in response to EN being set to a logic 0. The control circuit is configured to initialize the sample and hold circuit 530 by holding one of nodes 570 or 572 at Vdd according to the state of the mode selection signal Clk, and thereby place each of the cross-coupled inverters 538/540 and 542/544 in a defined state. It is noted that the signal Clk may not be constant when the sample and hold circuit is disabled. In this example, a first logical NAND circuit 512 holds node 570 to Vdd via transistor 516 in response to the control signal EN being set to logic 0 and the Clk signal being set to logic 1. A second logical NAND circuit 528 holds node 572 at Vdd via transistor 526 if the control signal EN is set to logic 0 and the Clk signal is set to logic 0. Transistors 514 and 522 are included to protect transistors 516 and 526 against an overvoltage that would otherwise damage them.

Figure 6:
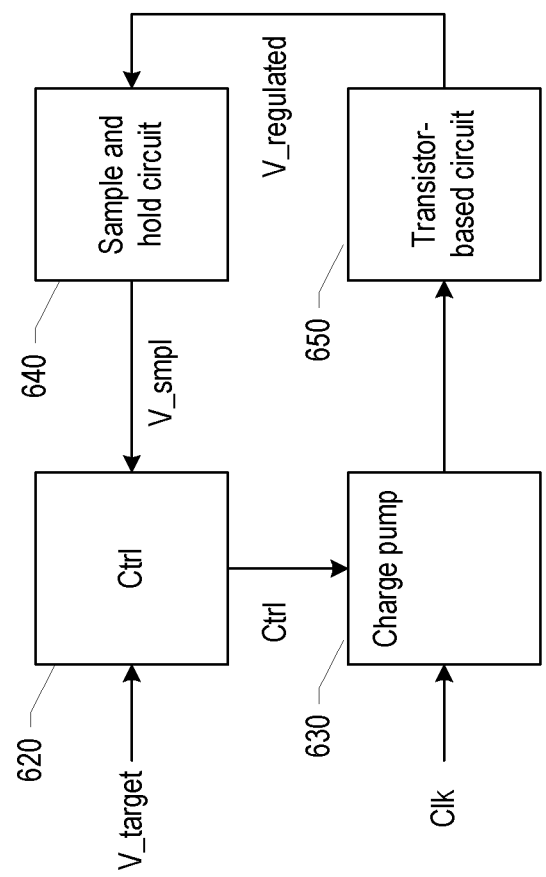
FIG. 6 shows a system level diagram of an apparatus including a voltage difference sample and hold circuit, in accordance with one or more embodiments of the present disclosure.

FIG. 6 shows a system level diagram of an apparatus including a voltage sample and hold circuit, in accordance with one or more embodiments of the present disclosure. The apparatus includes a charge pump 630 configured to generate a regulated voltage. In this example, the regulated voltage may be a voltage above or below the supply voltage rails for forward or reverse biasing of bodies of transistors of a transistor-based circuit 650. In this example, the apparatus includes a sample and hold circuit 640 configured to sample the regulated voltage as described with reference to FIGS. 1, 2, 3, 4, and 5. The apparatus also includes a control circuit 620 configured to adjust the operation of the charge pump based on the voltage sampled by the sample and hold circuit 640 and V_target.

A skilled artisan would recognize that terminology used in the Specification (including claims) connotes a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, unit, controller, and/or other circuit-type depictions (e.g., reference numerals 110, 112, 114, and 116 of FIG. 1 depict a block/module as described herein). Such circuits or circuitry are used together with other elements to exemplify how certain embodiments may be carried out in the form of structures, steps, functions, operations, activities, etc. For example, in certain of the above-discussed embodiments, discrete logic circuits and/or programmable logic circuits may be used to implement the operations/activities described with reference to the figures (e.g., control block 520 shown in FIG. 5), In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process is used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit). As another example, where the Specification may make reference to a "first [type of structure]", a "second [type of structure]", etc., where the [type of structure] might be replaced with terms such as ["circuit", "circuitry" and others], the adjectives "first" and "second" are not used to connote any description of the structure or to provide any substantive meaning; rather, such adjectives are merely used for English-language antecedence to differentiate one such similarly-named structure from another similarly-named structure (e.g., "first circuit configured to convert . . . " is interpreted as "circuit configured to convert . . . ").

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. Such modifications do not depart from the true spirit and scope of various aspects of the disclosure, including aspects set forth in the claims.

What is claimed is:

1. An apparatus, comprising:
a sample and hold circuit including a first capacitor and a second capacitor and configured and arranged to
in a first mode
sample a voltage difference between an input node of the sample and hold circuit and a first reference voltage using the first capacitor; and
provide a voltage stored by the second capacitor, and referenced to a second reference voltage, to a first output node of the sample and hold circuit; and
in a second mode
sample a voltage difference between the input node and the first reference voltage using the second capacitor; and
provide a voltage stored by the first capacitor, and referenced to the second reference voltage, to a second output node of the sample and hold circuit; and
wherein the sample and hold circuit includes a set of components including capacitors and transistors, each component being subject to failure in response to a voltage difference between at least a pair of terminals of the component exceeding the tolerance voltage of the component and the voltage difference between the input node and the second reference voltage is greater than the tolerance voltage of the components.

2. The apparatus of claim 1, wherein the sample and hold circuit further includes a switching circuit configured and arranged to
in the first mode
connect a first terminal of the first capacitor to the input node, a second terminal of the first capacitor to the first reference voltage, a first terminal of the second capacitor to an output node, and a second terminal of the second capacitor to the second reference voltage;
disconnect the first terminal of the first capacitor from the output node, the second terminal of the first capacitor from the second reference voltage, the first terminal of the second capacitor from the input node, and the second terminal of the second capacitor from the first reference voltage; and
in the second mode
connect the first terminal of the second capacitor to the input node, the second terminal of the second capacitor to the first reference voltage, the first terminal of the first capacitor to the output node, and the second terminal of the first capacitor to the second reference voltage; and
disconnect the first terminal of the second capacitor from the output node, the second terminal of the second capacitor from the second reference voltage, the first terminal of the first capacitor from the input node, and the second terminal of the first capacitor from the first reference voltage.

3. The apparatus of claim 2, wherein
the switching circuit includes a set of transistors;
a voltage at the first terminal of the first capacitor is used to control one or more of the set of transistors that performs the connecting of the first terminal of the second capacitor to the input node and the connecting of the first terminal of the second capacitor to the output node; and
a voltage at the first terminal of the second capacitor is used to control one or more of the set of transistors that perform the connecting of the first terminal of the first capacitor to the input node and perform the connecting of the first terminal of the first capacitor to the output node.

4. The apparatus of claim 1, wherein the sample and hold circuit is configured and arranged to operate in the first mode in response to a clock signal having a first value and operate in the second mode in response to the clock signal having a second value.

5. The apparatus of claim 1, further comprising a control circuit configured and arranged to
disable and initialize the sample and hold circuit in response to a control signal being set to a first value; and
enable the sample and hold circuit in response to the control signal being set to a second value.

6. The apparatus of claim 5, wherein the control circuit is configured and arranged to disable and initialize the sample and hold circuit by connecting a terminal of one of the first and second capacitors to the first reference voltage.

7. The apparatus of claim 5, wherein the control circuit includes
a first circuit configured to connect a first terminal of the first capacitor to the second reference node in response to the control signal being set to the first value and the sample and hold circuit operating in the first mode; and
a second circuit configured to connect a first terminal of the first capacitor to the second reference node in response to the control signal being set to the first value and the sample and hold circuit operating in the second mode.

8. The apparatus of claim 1, wherein
the first reference voltage is Vdd;
the second reference voltage is Vss; and
a voltage of the input node is greater than Vdd.

9. The apparatus of claim 1, wherein
the first reference voltage is Vss;
the second reference voltage is Vdd; and
a voltage of the input node is less than Vss.

10. A method comprising:
in a first mode, using a switching circuit
connecting a first capacitor to sample a voltage difference between an input node and a first reference voltage using a first capacitor; and connecting a second capacitor to provide a voltage stored by a second capacitor and referenced to a second reference voltage to a first output node; and in a second mode, using the switching circuit connecting the second capacitor to sample a voltage difference between the input node and the first reference voltage; and connecting the first capacitor to provide a voltage stored by the first capacitor and referenced to the second reference voltage to a second output node; and wherein the switching circuit includes a set of components including capacitors, transistors or a combination thereof, each component being subject to failure in response to a voltage difference between at least a pair of terminals of the component exceeding the tolerance voltage of the component and the voltage difference between the input node and the second reference voltage is greater than the tolerance voltage of the components.

11. The method of claim 10, further comprising, using the switching circuit connected to the first and second capacitors, in the first mode connecting a first terminal of the first capacitor to the input node, a second terminal of the first capacitor to the first reference voltage, a first terminal of the second capacitor to an output node, and a second terminal of the second capacitor to the second reference voltage; and disconnecting the first terminal of the first capacitor from the output node, the second terminal of the first capacitor from the second reference voltage, the first terminal of the second capacitor from the input node, and the second terminal of the second capacitor from the first reference voltage; and in the second mode connecting the first terminal of the second capacitor to the input node, the second terminal of the second capacitor to the first reference voltage, the first terminal of the first capacitor to the output node, and the second terminal of the first capacitor to the second reference voltage; and disconnecting the first terminal of the second capacitor from the output node, the second terminal of the second capacitor from the second reference voltage, the first terminal of the first capacitor from the input node, and the second terminal of the first capacitor from the first reference voltage.

12. The method of claim 11, wherein the switching circuit includes a set of transistors;

a voltage at the first terminal of the first capacitor is used to control one or more of the set of transistors that performs the connecting of the first terminal of the second capacitor to the input node and the connecting of the first terminal of the second capacitor to the output node; and a voltage at the first terminal of the second capacitor is used to control one or more of the set of transistors that perform the connecting of the first terminal of the first capacitor to the input node and perform the connecting of the first terminal of the first capacitor to the output node.

13. The method of claim 10, further comprising operating in the first mode in response to a clock signal being set to a first value and operating in the second mode in response to the clock signal being set to a second value.

14. The method of claim 10, further comprising, using a control circuit coupled to the sample and hold circuit disabling and initializing the sample and hold circuit in response to a control signal having a first value; and enabling the sample and hold circuit in response to the control signal having a second value.

15. The method of claim 14, wherein the disabling and initializing of the sample and hold circuit includes connecting a terminal of one of the first and second capacitors to the first reference voltage.

16. The apparatus of claim 14, wherein the control circuit includes a first circuit configured to connect a first terminal of the first capacitor to the second reference node in response to the control signal being set to the first value and the sample and hold circuit operating in the first mode; and a second circuit configured to connect a first terminal of the first capacitor to the second reference node in response to the control signal being set to the first value and the sample and hold circuit operating in the second mode.

17. The method of claim 10, wherein the first reference voltage is Vdd;

the second reference voltage is Vss; and a voltage of the input node is greater than Vdd.

18. The method of claim 10, wherein the first reference voltage is Vss;

the second reference voltage is Vdd; and a voltage of the input node is less than Vss.

* * * * *